(12) United States Patent
Alvandpour et al.

(10) Patent No.: US 6,717,441 B2
(45) Date of Patent: Apr. 6, 2004

(54) FLASH [II]-DOMINO: A FAST DUAL-RAIL DYNAMIC LOGIC STYLE

(75) Inventors: Atila Alvandpour, Portland, OR (US); Per Larsson-Edefors, Rimforsa (SE); Ram K. Krishnamurthy, Beaverton, OR (US); Krishnamurthy Soumyanath, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 134 days.

(21) Appl. No.: 10/021,544

(22) Filed: Oct. 22, 2001

(65) Prior Publication Data

US 2003/0076132 A1 Apr. 24, 2003

(51) Int. Cl.[7] .............................................. H03K 19/096
(52) U.S. Cl. .............................. 326/95; 326/98; 326/93; 327/208
(58) Field of Search .............................. 326/93, 95, 98; 327/208–212, 51–57

(56) References Cited

U.S. PATENT DOCUMENTS

| | | | | | |
|---|---|---|---|---|---|
| 5,384,493 | A | * | 1/1995 | Furuki | 327/203 |
| 5,455,528 | A | * | 10/1995 | Partovi et al. | 326/98 |
| 5,777,491 | A | * | 7/1998 | Hwang et al. | 326/113 |
| 5,917,355 | A | * | 6/1999 | Klass | 327/208 |
| 6,028,454 | A | * | 2/2000 | Elmasry et al. | 326/115 |
| 6,331,791 | B1 | * | 12/2001 | Huang | 326/98 |

* cited by examiner

*Primary Examiner*—Vibol Tan
(74) *Attorney, Agent, or Firm*—Blakely, Sokoloff, Taylor & Zafman LLP

(57) ABSTRACT

A dual-rail static logic gate with a self cut-off mechanism is disclosed. In an embodiment, the output of the first rail is coupled to the input of the pull-up device of the second rail and vice versa. The cross-coupling allows the self cut-off mechanism of the static gate to function properly and provides for components which have lower capacitance than conventional static gates. The lower capacitance results in a faster static gate.

14 Claims, 2 Drawing Sheets

FLASH [II]-DOMINO: A FAST DUAL-RAIL DYNAMIC LOGIC STYLE

FIELD OF THE INVENTION

This invention relates generally to logic circuits, and more particularly to domino logic circuits.

BACKGROUND

With the growing complexity of modern computer systems, designers are constantly seeking more efficient methods to reduce power and cost, while increasing speed. Generally, the major components in a computer system are formed from the combination of millions of logic gates. Typically, the power, cost, and speed of the components correlate to the operation efficiency of these logic gates. By significantly improving the performance of the logic gate, the overall performance of the computer system can be improved.

One type of well known logic circuit is a domino logic circuit which has a series of logic gates coupled together. Specifically, domino logic circuits have dynamic gates and static gates coupled together in a serial fashion such that the gates alternate between dynamic and static. Typically, the dynamic gates are simple and fast because they do not use p-type metal oxide semiconductor ("PMOS") transistors to propagate an input signal.

Rather, the dynamic gates use a PMOS transistor only for precharging each of the dynamic gates. Conversely, conventional static gates are more complex and include a complementary PMOS network, which is comprised of a plurality of interconnected PMOS transistors. The PMOS network results in an increase in capacitance experienced during the evaluation phase. The increased capacitance results in slower switching speeds, which results in lower system performance.

Moreover, conventional static gates often include two or more PMOS which are stacked together, which requires that the transistors be upsized, which further increases the capacitance experienced through the gate. Therefore, conventional static gates are known to act as a bottle neck for the domino logic circuit.

DESCRIPTION OF THE DRAWINGS

Various embodiments are illustrated by way of example and not by way of limitation in the figures of the accompanying drawings in which like references indicate similar elements. It should be noted that references to "an," "one," or "various" embodiments in this disclosure are not necessarily to the same embodiment, and such references mean at least one.

DETAILED DESCRIPTION

Various embodiments disclosed herein overcome the problems in the existing art described above by replacing the conventional static gate of a domino logic circuit with a self cut-off pseudo static gate which uses ratio logic. In the following description, for the purposes of explanation, numerous specific details are set forth in order to provide a thorough understanding of the various embodiments. It will be apparent, however, to one skilled in the art that the embodiments may be practiced without some of these specific details. For example, various signals, layout patterns and logical circuits may be modified according to the teachings of the various embodiments.

The following description and the accompanying drawings provide examples for the purposes of illustration. However, these examples should not be construed in a limiting sense as they are not intended to provide an exhaustive list of all possible implementations. In other instances, well known structures and devices are omitted or simplified in order to avoid obscuring the details of the various embodiments.

Figures 1, 2:
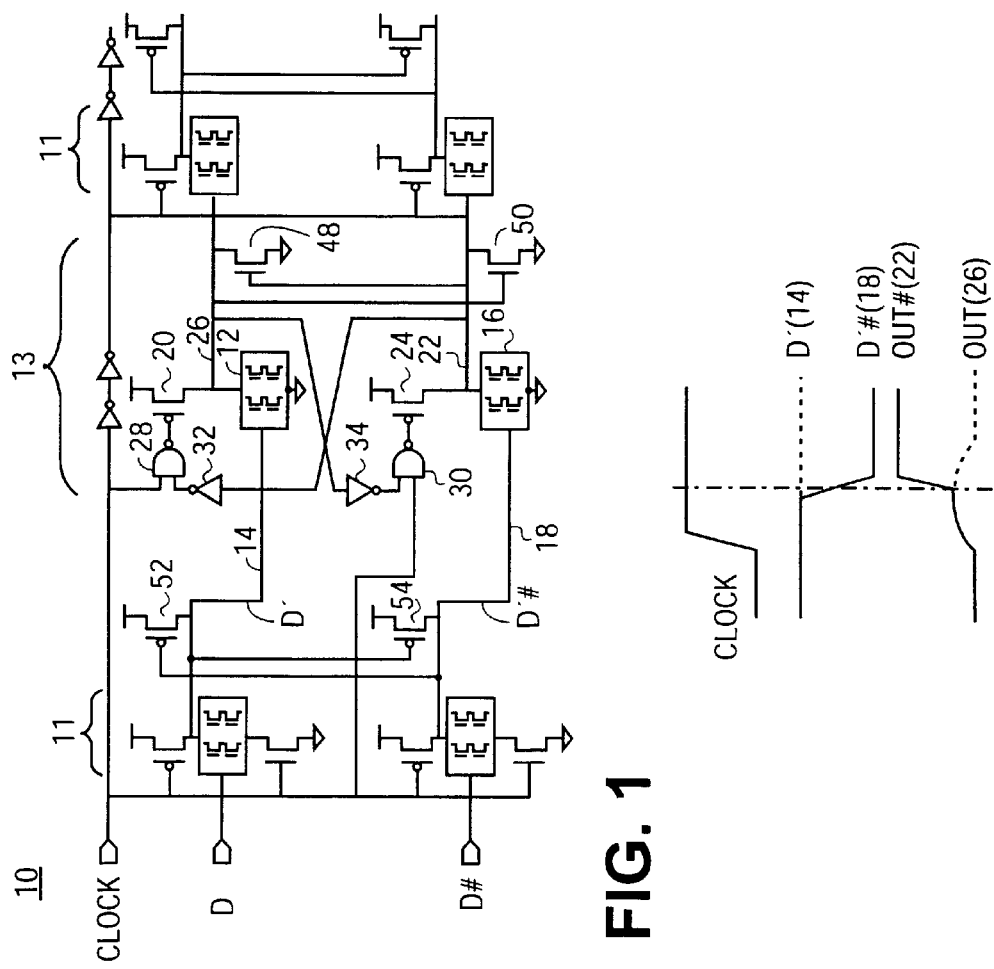
FIG. 1 is a domino logic circuit according to an embodiment.
FIG. 2 is a timing chart which shows the behavior of the input and output signals of an embodiment in relation to the clock signal.

Referring now to FIG. 1, a portion of domino logic circuit 10 is shown according to an embodiment. Domino logic circuit 10 includes a plurality of dynamic gates 11 and a plurality of static logic gates 13 coupled to dynamic logic gates 11 such that dynamic gates 11 and static gates 13 are alternately connected in series. Each static logic gate 13 comprises first pull-down device 12 which has first input line 14 coupled thereto and second pull-down device 16 which has second input line 18 coupled thereto. In addition, each static gate 13 includes first pull-up device 20 which has an input to be driven by output 22 of second pull-down device 16 and second pull-up device 24 which has an input to be driven by output 26 of first pull-down device 12.

Figure 3:
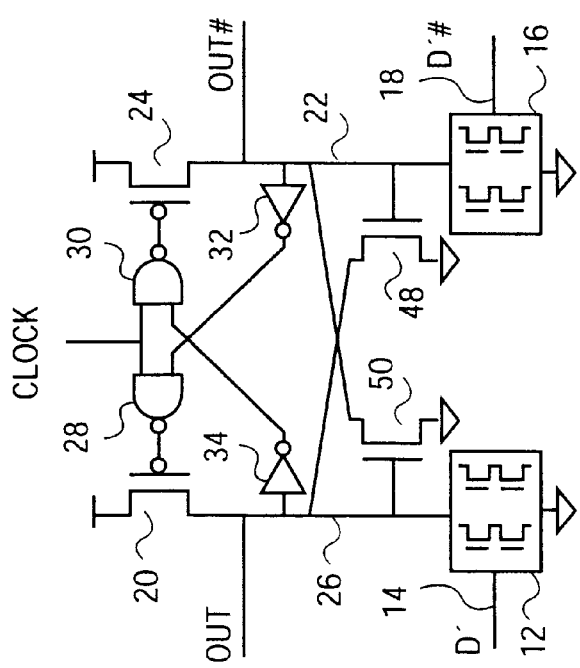
FIG. 3 is a schematic of the static gate shown in FIG. 1.

FIG. 3 shows static gate 13 of FIG. 1. In such an embodiment, first pull-down device 12 and second pull-down device 16 each comprise an n-type metal oxide semiconductor ("NMOS") pull-down network, which is comprised of a plurality of interconnected NMOS transistors. First pull-up device 20 and second pull-up device 24 each comprise a single PMOS transistor, and a clock may be coupled to a gate of first pull-up device 20 by first logical NAND gate 28. Likewise, the clock may also be coupled to a gate of second pull-up device 24 by second logical NAND gate 30.

In embodiments which include the clock coupled to the pull-up devices as described above, output 22 of second pull-down device 16 may be coupled to the gate of first pull-up device 20 by first inverter 32 and first logical NAND gate 28. Likewise, output 26 of first pull-down device 12 may be coupled to the gate of second pull-up device 24 by second inverter 34 and second logical NAND gate 30.

Figure 4:
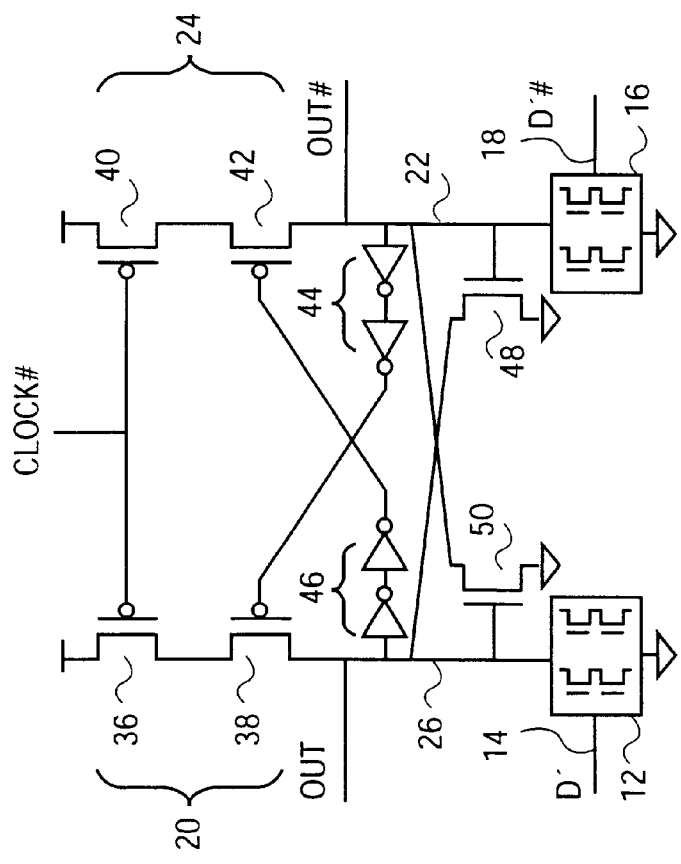
FIG. 4 is an alternative embodiment of the static gate shown in FIG. 3.

In other embodiments, first pull-up device 20 and second pull-up device 24 each comprise a plurality of PMOS transistors. An example of this embodiment is shown in FIG. 4. In the embodiment shown, a clock is coupled to a gate of first transistor 36 of first pull-up device 20, and the clock is also coupled to a gate of first transistor 40 of second pull-up device 24. In addition, output 22 of second pull-down device 16 is coupled to a gate of second transistor 38 of first pull-up device 20 by plurality of inverters 44, and output 26 of first pull-down device 12 is coupled to a gate of second transistor 42 of second pull-up device 24 by plurality of inverters 46.

In various embodiments, static gate 13 further comprises first NMOS transistor 48 having a drain coupled to output 26 of first pull-down device 12 and a gate to be driven by output 22 of second pull-down device 16. Likewise, second NMOS transistor 50 has a drain coupled to output 22 of second pull-down device 16 and a gate to be driven by output 26 of first pull-down device 12. These embodiments include the NMOS transistors to act as keepers to maintain the outputs of the two pull-down devices in a complementary state during the evaluation phase.

Similarly, in various embodiments first PMOS transistor is 52 has a drain coupled to first input line 14 and a gate to be driven by second input line 18. In addition, second PMOS transistor 54 has a drain coupled to second input line 18 and a gate to be driven by first input line 14. These PMOS transistors also act as keepers to maintain complementary functioning of domino logic circuit 10 during the evaluation phase.

Turning now to FIG. 2, the input/output waveforms of static gate 13 are shown. During the precharge phase, the clock is low and the outputs of dynamic gate 11 are both high (e.g. input lines 14 and 18). As a result, outputs 26 and 22 are both low. In addition, pull-up devices 20 and 24 are both OFF since the outputs of NAND gates 28 and 30 are both high (since clock is low and outputs 26 and 22 are both low).

Once the clock goes high, the pseudo logic (or ratio logic) phase begins. This pseudo logic phase is very short relative to a clock period and occurs before the complementary inputs D' (input line 14) and D' # (input line 18) commence their final complementary state during the evaluation phase. During the pseudo logic phase, pull-up devices 20 and 24 and precharged pull-down devices 12 and 16 are all ON and conducting.

Thus, the voltage levels of outputs 26 and 22 are determined by the DC-gain ratio of the pull-up/pull-down devices. The gain ratio is designed such that outputs 22 and 26 are still within the margins to be evaluated as low signals for the next dynamic gates. The output waveform of FIG. 2 shows the effects of this pseudo logic phase.

Specifically, the pseudo logic phase effect on static gate 13 is evidenced by the slight raise in Out (output 26) and Out# (output 22) when the clock goes high, but despite the slight raise, both signals are still considered low. Once inputs D' and D' # begin to act in a complementary fashion during the evaluation phase, the output signals also begin to behave in a complementary nature since one of the pull-down networks stops conducting.

The self cut-off of one of the pull-down networks of static gate 13 to achieve complementary functioning of the outputs is accomplished, in part, by cross coupling the output of one rail with the input of the pull-up device of the other rail and vice versa. Such a cross coupling can be seen in FIGS. 1, 3 and 4.

By utilizing static gates with a self cut-off mechanism as disclosed herein, circuit performance increases up to 30% over conventional domino logic circuits, which do not implement the self cut-off pseudo static gates disclosed herein.

It is to be understood that even though numerous characteristics and advantages of various embodiments have been set forth in the foregoing description, together with details of structure and function of the various embodiments, this disclosure is illustrative only. Changes may be made in detail, especially matters of structure and management of parts, without departing from the scope of the various embodiments as expressed by the broad general meaning of the terms of the appended claim.

What is claimed is:

1. A logic gate comprising:
 a first pull-down device having a first input line coupled thereto;
 a second pull-down device having a second input line coupled thereto;
 a first pull-up device having an input to be driven by an output of the second pull-down device;
 a second pull-up device having an input to be driven by an output of the first pull-down device;
 a first logical NAND gate coupled between a clock and a gate of the first pull-up device; and
 a second logical NAND gate coupled between the clock and a gate of the second pull-up device.

2. The logic gate of claim 1, wherein the first pull-down device and the second pull-down device each comprise an n-type metal oxide semiconductor pull-down network.

3. The logic gate of claim 1, wherein the first pull-up device and the second pull-up device each comprise a p-type metal oxide semiconductor transistor.

4. The logic gate of claim 1, further comprising:
 a first inverter coupled between the output of the second pull-down device and the first logical NAND gate; and
 a second inverter coupled between the output of the first pull-down device and the second logical NAND gate.

5. A logic gate comprising:
 a first pull-down device having a first input line coupled thereto;
 a second pull-down device having a second input line coupled thereto;
 a first pull-up device having an input to be driven by an output of the second pull-down device;
 a second pull-up device having an input to be driven by an output of the first pull-down device;
 a first plurality of inverters coupled between the output of the second pull-down device and a gate of a first transistor of the first pull-up device; and
 a second plurality of inverters coupled between the output of the first pull-down device and a first transistor of the second pull-up device.

6. The logic gate of claim 5, wherein the first pull-up device and the second pull-up device each comprise a plurality of p-type metal oxide semiconductor transistors.

7. The logic gate of claim 6, further comprising:
 a clock coupled to a gate of a second transistor of the first pull-up device, the clock also coupled to a gate of a second transistor of the second pull-up device.

8. A domino logic circuit comprising:
 a plurality of dynamic logic gates;
 a plurality of static logic gates coupled to the dynamic logic gates such that the dynamic gates and the static gates are alternately connected in series, the static logic gates each comprising
 a first pull-down device having a first input line coupled thereto;
 a second pull-down device having a second input line coupled thereto;
 a first pull-up device having an input to be driven by an output of the second pull-down device; and
 a second pull-up device having an input to be driven by an output of the first pull-down device;
 a first logical NAND gate coupled between a clock and a gate of the first pull-up device; and
 a second logical NAND gate coupled between the clock and a gate of the second pull-up device.

9. The domino logic circuit of claim 8, wherein the first pull-down device and the second pull-down device each comprise and n-type metal oxide semiconductor pull-down network.

10. The domino logic circuit of claim 8, wherein the first pull-up device and the second pull-up device each comprise a p-type metal oxide semiconductor transistor.

11. The domino logic circuit of claim 8, further comprising:
- a first inverter coupled between the output of the second pull-down device and the first logical NAND gate; and
- a second inverter coupled between the output of the first pull-down device and the second logical NAND gate.

12. A domino logic circuit comprising:
- a plurality of dynamic logic gates;
- a plurality of static logic gates coupled to the dynamic logic gates such that the dynamic gates and the static gates are alternately connected in series, the static logic gates each comprising
  - a first pull-down device having a first input line coupled thereto;
  - a second pull-down device having a second input line coupled thereto;
  - a first pull-up device having an input to be driven by an output of the second pull-down device; and
  - a second pull-up device having an input to be driven by an output of the first pull-down device;
- a first plurality of inverters coupled between the output of the second pull-down device and a gate of a first transistor of the first pull-up device; and
- a second plurality of inverters coupled between the output of the first pull-down device and a first transistor of the second pull-up device.

13. The domino logic circuit of claim 12, wherein the first pull-up device and the second pull-up device each comprise a plurality of p-type metal oxide semiconductor transistors.

14. The domino logic circuit of claim 13, further comprising:
- a clock coupled to a gate of a second transistor of the first pull-up device, the clock also coupled to a gate of a second transistor of the second pull-up device.

* * * * *

UNITED STATES PATENT AND TRADEMARK OFFICE
CERTIFICATE OF CORRECTION

PATENT NO. : 6,717,441 B2
DATED : April 6, 2004
INVENTOR(S) : Alvandpour et al.

It is certified that error appears in the above-identified patent and that said Letters Patent is hereby corrected as shown below:

Column 3,
Line 5, delete "is".

Signed and Sealed this

Twelfth Day of April, 2005

JON W. DUDAS
*Director of the United States Patent and Trademark Office*